(12) United States Patent
Brunette et al.

(10) Patent No.: US 7,154,356 B2
(45) Date of Patent: Dec. 26, 2006

(54) RADIO FREQUENCY (RF) CIRCUIT BOARD TOPOLOGY

(75) Inventors: Gilbert P. Brunette, Ottawa (CA); Eric Johnson, Nepean (CA); Stephen G. Rayment, Ottawa (CA); Colin Soul, Ottawa (CA)

(73) Assignee: BelAir Networks Inc., Kanata (CA)

( * ) Notice: Subject to any disclaimer, the term of this patent is extended or adjusted under 35 U.S.C. 154(b) by 0 days.

(21) Appl. No.: 11/351,041

(22) Filed: Feb. 9, 2006

(65) Prior Publication Data

US 2006/0125573 A1   Jun. 15, 2006

Related U.S. Application Data

(62) Division of application No. 10/790,336, filed on Mar. 1, 2004.

(51) Int. Cl.
H03H 7/38 (2006.01)
(52) U.S. Cl. .......................................... 333/33; 174/250
(58) Field of Classification Search .................. 333/33, 333/238, 246, 260, 24 R
See application file for complete search history.

(56) References Cited

U.S. PATENT DOCUMENTS

| | | | |
|---|---|---|---|
| 4,023,125 A | 5/1977 | Wolfe | |
| 4,494,083 A | 1/1985 | Josefsson et al. | |
| 5,522,132 A | 6/1996 | Mattei | |
| 5,920,242 A | 7/1999 | Oya et al. | |
| 6,031,188 A | 2/2000 | Pluymers et al. | |
| 6,172,305 B1 | 1/2001 | Tanahashi | |
| 6,184,477 B1 | 2/2001 | Tanahashi | |
| 6,329,604 B1 | 12/2001 | Koya | |
| 6,356,173 B1 | 3/2002 | Nagata et al. | |
| 6,388,206 B1 | 5/2002 | Dove et al. | |
| 6,441,471 B1 | 8/2002 | Maetani | |
| 6,501,181 B1 | 12/2002 | Albinsson | |
| 6,541,712 B1 | 4/2003 | Gately et al. | |
| 6,614,325 B1 | 9/2003 | Kocin | |
| 6,617,943 B1 | 9/2003 | Fazelpour | |

(Continued)

FOREIGN PATENT DOCUMENTS

WO    WO 03/019999 A1    3/2003

OTHER PUBLICATIONS

Chen et al., Via and Return Path Discontinuity Impact on High Speed Digital Signal Quality, EPEP Conf., www.sigrity.com; pp. 1-4 (Oct. 2000).

(Continued)

*Primary Examiner*—Stephen E. Jones
(74) *Attorney, Agent, or Firm*—IPLM Group, P.A.

(57) ABSTRACT

An interconnection structure for interconnecting circuitry on a first conductive layer to circuitry on a second conductive layer is provided. The interconnection structure of the present invention comprises a signal conductor via surrounded by a plurality of ground vias. The plurality of ground vias shield the signal conductor via, thus providing electrical isolation for the conductor via from the rest of the circuitry. One feature of the present invention is that the plurality of ground vias can be modified, adjusting their diameters and their placement relative to the signal conductor via, in order to affect the overall characteristic impedance of the interconnection structure. This feature is useful when propagating high frequency signals between signal traces on different conductive layers of a printed circuit board. In view of the high frequencies used in today's wireless communication systems, the interconnection structure proposed aids in the practical implementation of radio frequency modules by mitigating the effects of impedance discontinuities ordinarily present at signal trace-to-via transition regions.

9 Claims, 4 Drawing Sheets

U.S. PATENT DOCUMENTS

2002/0154059 A1    10/2002    Lindenmeier et al.
2003/0179055 A1     9/2003    Sweeney et al.

OTHER PUBLICATIONS

Cohen et al., Signal Integrity Considerations for High Speed Data Transmission in a Printed Circuit Board System; IMAPS 1998, www.teradyne.com, pp. 1-6 (1998).

Cohen, Tom, Practical Guidelines for the Implementation of Back Drilling Plated Through Hole Vias in Multi-gigabit Board Applications; DesignCon 2003, pp. 1-10, Nashua, NH, US (2003).

Sarfaraz et al., Interconnect Characterization . . . Digital Applications, (rambus.com), IEEE 9th Topical Meeting Electrical Performance, pp. 1-4, Mountain View, CA, US (Oct. 23-25, 2000).

Tallo, Joseph, Designing an X-Band T/R Module Package, Kyocera, Ansoft 2003 HFSS Users Workshop, www.ansoft.com, pp. 1-32 (2003).

Ultracad Design Inc., The Effects of Vias on PCB Traces, ultracad.com, pp. 1-6, Bellevue, WA, US (1994).

DETAIL A-A

RADIO FREQUENCY (RF) CIRCUIT BOARD TOPOLOGY

This application is a divisional of U.S. patent application Ser. No. 10/790,336, filed Mar. 1, 2004, which is incorporated by reference herein.

FIELD OF THE INVENTION

The present invention relates to printed circuit board design and, more particularly, to a novel circuit board topology for use in radio frequency products that mitigates the deleterious parasitic effects introduced by vias or plated through holes.

BACKGROUND TO THE INVENTION

Design engineers today are facing more and more challenges. Printed circuit boards are getting more and more complex as physical size at the board, package, and chip level continues to decrease. These structures are also expected to perform at higher speeds. Reducing feature size results in lower costs and faster time to market. However, high density also means more conductive metal layers and more signal traces routed on smaller and thinner boards.

To facilitate electrical communication between conductive layers, a class of well known structures called vias are used. In general, vias are openings etched through dielectric layers between a first conductive layer and a second conductive layer. Vias can be formed by drilling holes and then plating the paths through the holes. The via holes can extend through the complete multilayer board in which case they are called plated through holes. In this configuration, the vias are electrically coupled to each conductive (e.g. copper) layer. As aspect ratios become worse and worse and signal frequencies continue to rise—a trend certain to continue in the future—each signal trace will inevitably exhibit transmission line effects, thereby degrading the signal integrity.

Generally speaking, the parasitic capacitance and inductance of a via hole are small. In fact, in low frequency applications, vias may be constructed between circuit board layers with little or no consideration for the parasitic capacitances and inductances they exhibit. Accordingly, at lower frequencies and slower rise times, the effects of a via or plated through hole on circuit performance are negligible.

However, in high frequency applications, one problem with via structures is the lack of AC electrical isolation between the vias and the remainder of the microcircuit. Another problem is that standard via holes do not provide a controlled impedance environment at high frequencies and, therefore, present discontinuities or changes in impedance along the signal path. Such discontinuities may cause signal reflections (or "ringing") of high speed digital and analog signals. Specifically, at higher frequencies, such departure from a uniform propagation structure results in parasitic elements being formed at the junctions between the circuit traces and the via itself.

For example, with regard to a standard via structure passing through an entire multilayer board, a small circular or rectangular pad is typically added to each end of the plated through hole so that the plating process that creates the complete via will have some material to which it can anchor to at each end of the structure during fabrication. At sufficiently high frequencies, the small capacitance formed between this via pad and the surrounding metal structures (comprising any signal or ground traces nearby be it on the surface of the board or within buried layers) will form a reactive impedance equal to $1/j\omega C$ where C is the capacitance, $\omega$ is the frequency in radians per second and j designates the square root of $-1$. Such reactive impedance will, in turn, result in an impedance mismatch at the trace-to-via junction and energy will, accordingly, be reflected back towards the source end. In addition, the plated through hole itself is a form of inductor in which currents flowing in the longitudinal direction of the via experience an inductive effect due to the basic electromagnetic properties found in wires.

Therefore, the electrical characteristics of a printed circuit board (PCB), used to physically mount and connect circuit components in a high frequency product, will have a significant impact on the performance of that product. In this regard, the term 'parasitic' is typically used to refer to a physical attribute of the PCB that has an effect on the performance of the circuit. Accordingly, the potential magnitude of the negative effect of the PCB design on performance increases with frequency as the parasitic elements tend to a similar magnitude to the typical lumped components used.

In general, a standard via structure may be viewed as a transmission line (or waveguide) without sidewalls. The need to move signals between various layers of a printed circuit board, particularly at the higher frequencies used in today's wireless communication systems, has necessitated the creation of unique radio frequency (RF) circuit board structures to compensate for the impedance discontinuities introduced by via holes. Specifically, it would be desirable to realize a transmission line structure capable of transmitting high frequency signals between conductive traces on various layers of a board without degrading the transmission characteristics of such signals. To this end, reducing reflections (or return loss) at the trace-to-via transitions in RF circuit board applications may be achieved using a modified via structure simulating a quasi 50-ohm transmission line to move signals between various circuit layers of a board.

SUMMARY OF THE INVENTION

The signal trace-to-via transition of the present invention comprises a center signal conductor via surrounded by a plurality of ground vias. The plurality of ground vias shield the center conductor via, thus providing electrical isolation for the conductor via from the rest of the circuitry. One feature of the present invention is that the plurality of ground vias can be modified, adjusting their diameters and their placement relative to the center conductor via, in order to affect the overall characteristic impedance of the center conductor via. This feature is useful when propagating high frequency signals from one side of the substrate to another side.

In accordance with a first aspect of the present invention, an interconnection structure to connect a first conductive trace on a first conductive layer of a circuit board to a second conductive trace on a second conductive layer of the circuit board is provided comprising a signal conductor via connected at a first end to the first conductive trace and connected at a second end to the second conductive trace and wherein the signal conductor via propagates electrical signals between the first conductive trace on the first conductive layer and the second conductive trace on the second conductive layer of the circuit board. A plurality of ground vias surrounding the signal conductor via are further provided and the plurality of ground vias have a position relative to the signal conductor via based upon a desired overall impedance of the interconnection structure. Such an interconnection structure is especially useful in radio frequency circuits when propagating high frequency signals from one side of the board substrate to another side. For example, an interconnection structure in accordance with the present invention may be used in an antenna selection module for connecting at least one of a plurality of radio ports to at least one of a plurality of antenna ports in a radio frequency communication system.

In accordance with a further aspect of the present invention, an antenna selection module is provided for connecting at least one of a plurality of radio ports to at least one of a plurality of antenna ports in a radio frequency communication system. The antenna selection module comprises a first conductive layer having at least one of a plurality of radio ports and at least one first conductive trace thereon connected to at least one of the plurality of radio ports. The antenna selection module further comprises a second conductive layer having at least one of a plurality of antenna ports and at least one second conductive trace thereon connected to at least one of the plurality of antenna ports. The at least one first conductive trace is connected to the at least one second conductive trace by an interconnection structure comprising a signal conductor via connected at a first end to the at least one first conductive trace and at a second end to the at least one second conductive trace and a plurality of ground vias surrounding the signal conductor via wherein the plurality of ground vias have a position relative to the signal conductor via based upon a desired overall impedance of the interconnection structure.

In order to ease routing congestion of signal traces for a circuit while meeting space constraints, a signal trace on a first conductive layer may be connected to a signal trace on a second conductive later using the interconnection structure of the present invention. Advantageously, the novel interconnection structure of the present invention allows for the transmission of high frequency signals between signal traces on different conductive layers of a circuit while maintaining signal integrity. Specifically, the present invention mitigates the impedance discontinuities at signal trace-to-via transitions inherent at high frequencies.

Other aspects and features of the present invention will become apparent to those ordinarily skilled in the art upon review of the following description of specific embodiments of the invention in conjunction with the accompanying drawings.

BRIEF DESCRIPTION OF THE DRAWINGS

A better understanding of the invention will be obtained by considering the detailed description below, with reference to the following drawings in which.

DETAILED DESCRIPTION

The need to move signals between various conductive layers of a printed circuit board, particularly in relation to the RF circuits used in wireless communication systems, has necessitated the creation of unique radio frequency (RF) circuit board structures to compensate for the impedance discontinuities introduced by via holes. Specifically, to generate a low reflection interface, it is necessary to compensate for the non-ideal circuit effects introduced at signal trace-to-via transition regions.

In keeping with standard transmission line theory, those skilled in the art will appreciate that, for distributed lines, the impedance per unit length is given as the square root of the ratio of the inductance per unit length divided by the capacitance per unit length (i.e.). Since a standard signal conductor via has an inherent inductance per unit length, introducing a distributed capacitance per unit length will provide for a uniform impedance along the length of the via or plated hole itself. A distributed capacitance may be introduced by adding two or more vias nearby which are tied to ground potential. The signal conductor via and the respective surrounding grounded vias approximate a coaxial transmission line structure with the grounded vias taking on the role of the grounded sidewalls. The difference in potential between the signal conductor via and the surrounding ground vias results in a distributed capacitance per unit length.

Figure 1:
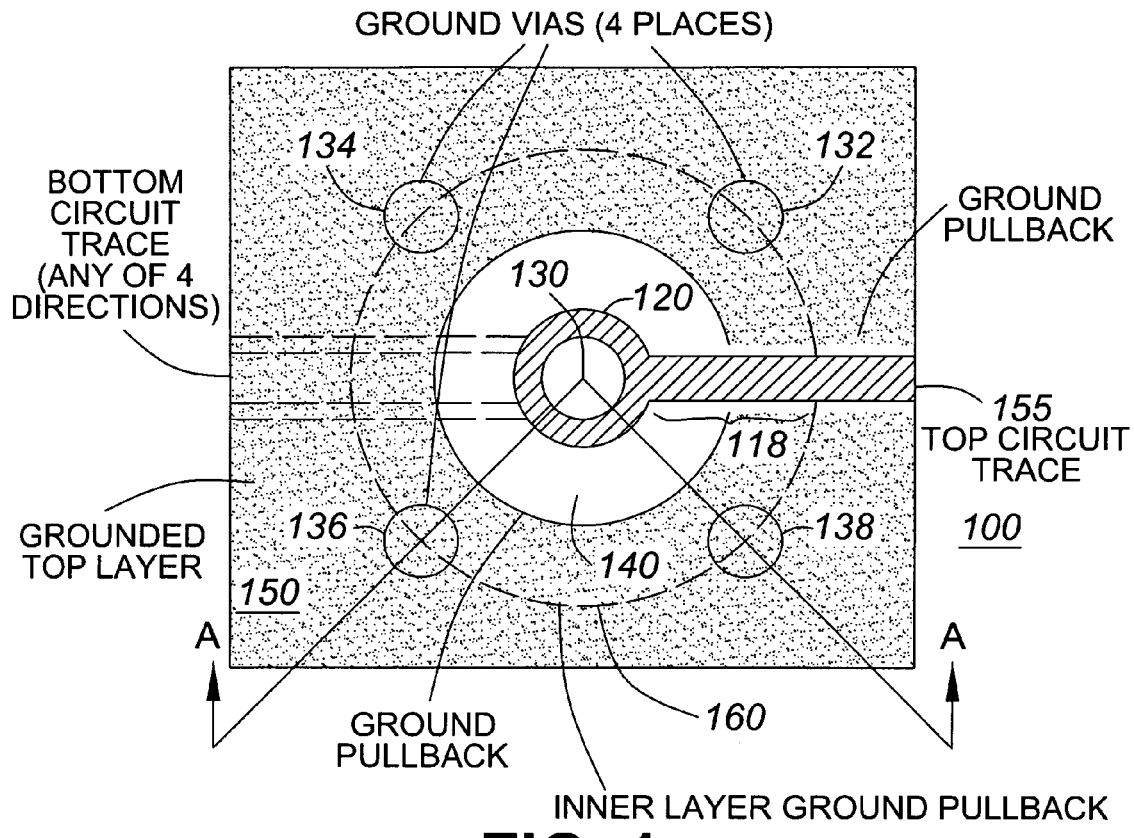
FIG. 1 depicts a top layer view of a circuit board showing a signal trace-to-via transition constructed in accordance with the present invention.

FIG. 1 depicts a top layer view of a printed circuit board 100 showing a signal trace-to-via transition constructed in accordance with a first aspect of the present invention. As seen, a top layer signal trace 155 terminates at a top layer via pad 120 of a signal conductor via 130. The signal conductor via 130 is surrounded by a plurality of ground vias 132, 134, 136 and 138. A space or top layer ground pull back region 140 isolates the signal conductor via 130 from a ground plane 150 which electrically grounds the plurality of ground vias 132, 134, 136 and 138. As can be seen, the ground plane 150 is formed in such a manner so as to also surround the signal trace 155. In this way, the signal trace 155 and the ground plane 150 together constitute a ground-backed coplanar transmission line. In FIG. 1, an inner layer ground pullback region 160 is indicated in FIG. 1 by the dashed circle, the purpose of which is discussed below.

In such a controlled impedance environment, the capacitance introduced may be adjusted to match the impedance of the signal (circuit) trace, resulting in a minimum reflection of energy at the signal trace-to-via transition. Controlling the impedance of the "signal conductor-ground vias" coaxial-like structure is accomplished by varying the diameters of the signal conductor and ground vias, as well as their relative position from one other. One benefit of this technique is that propagation of signals in a package employing the ground vias is enhanced while minimizing cross talk between signal conductors. It should be noted that FIG. 1 illustrates the centre signal conductor via 130 surrounded by four ground vias 132, 134, 136 and 138. It will be appreciated that the precise number of ground vias used may vary and is determined by system performance requirements. Impedance matching and isolation could be accomplished with as little as two ground vias. Increasing the number of ground vias increases electrical isolation. The above technique may be used within any impedance range and, furthermore, is applicable for signal conductor vias that extend from the top outer layer to the bottom outer layer of a printed circuit board, from the top or bottom outer layers to an inner conductive layer as well between inner conductive layers within a board (buried vias).

The transition from the uniform line structure of the signal conductor trace 155 in FIG. 1 to its associated plated via hole 130 inherently has several challenges. Firstly, as can be seen, the pad 120 at the end of the via is generally not the same size as the uniform line or signal conductor trace 155 that runs up to it. Any change in geometry along the line creates a discontinuity resulting in reflections of the signal if left uncompensated.

Secondly, it is well known from transmission line theory that a signal must be carried from source to load in a closed-loop path. Here, the "forward" path from the source to the load may be viewed as any given signal conductor trace. To complete the loop, a return path from the load to the source is needed. Such a return path is typically realized using a ground plane immediately adjacent or near the signal conductor trace layer. In this manner, electrons can flow from the source to the load and back to complete the circuit as needed.

Figure 2:
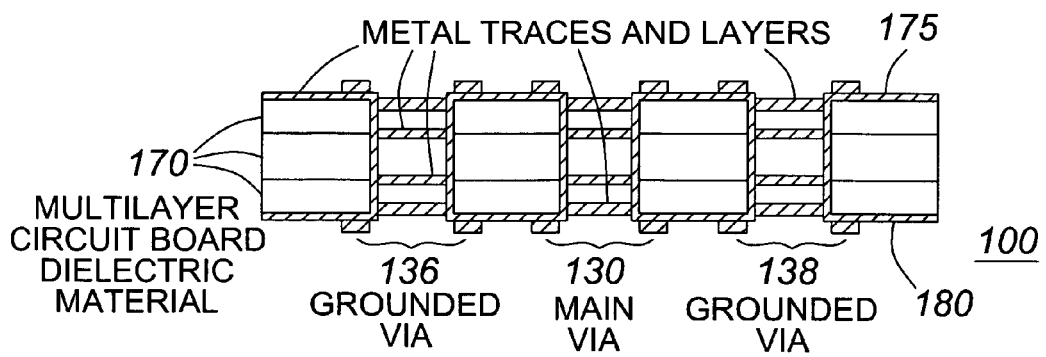
FIG. 2 illustrates a cross-sectional view of the structure in FIG. 1 taken along cut section A—A.

FIG. 2 shows a cross-sectional view of the structure in FIG. 1 taken along cut section A—A. As can be seen, the circuit board 100 comprises a plurality of layers of dielectric material 170. The circuit board 100 has a top metal trace (conductive) layer 175 and a bottom metal trace (conductive) layer 180. The signal conductor via 130 passes through the entire circuit board 100 from the top layer 175 to the bottom layer 180. Similarly, the ground vias 136 and 138 pass through the entire circuit board 100.

Those skilled in the art will appreciate that the standard technique for making a signal conductor trace-to-via connection is to run the signal conductor trace up to the via pad but to stop its corresponding ground return structure (underneath the signal trace layer) some distance from the via hole. This so-called ground pullback region is to avoid shorting the signal conductor trace to ground. For simplicity, standard structures tend to use one size for the ground pullback region as depicted by the inner layer ground pullback region 160 (dashed circle) in FIG. 1. The difficulty with this approach is that a section of the uniform signal conductor trace (section 118 in FIG. 1) that does not have its associated ground return plane underneath due to the corresponding standard size of inner layer ground pullback regions becomes inductive while the via pad is capacitive. However, by manipulating the ground plane topology beneath the signal trace-to-via transition, it is possible to compensate for the inductance of the line and the capacitance of the pad to generate a wideband compensated solution as described below.

Figure 3:
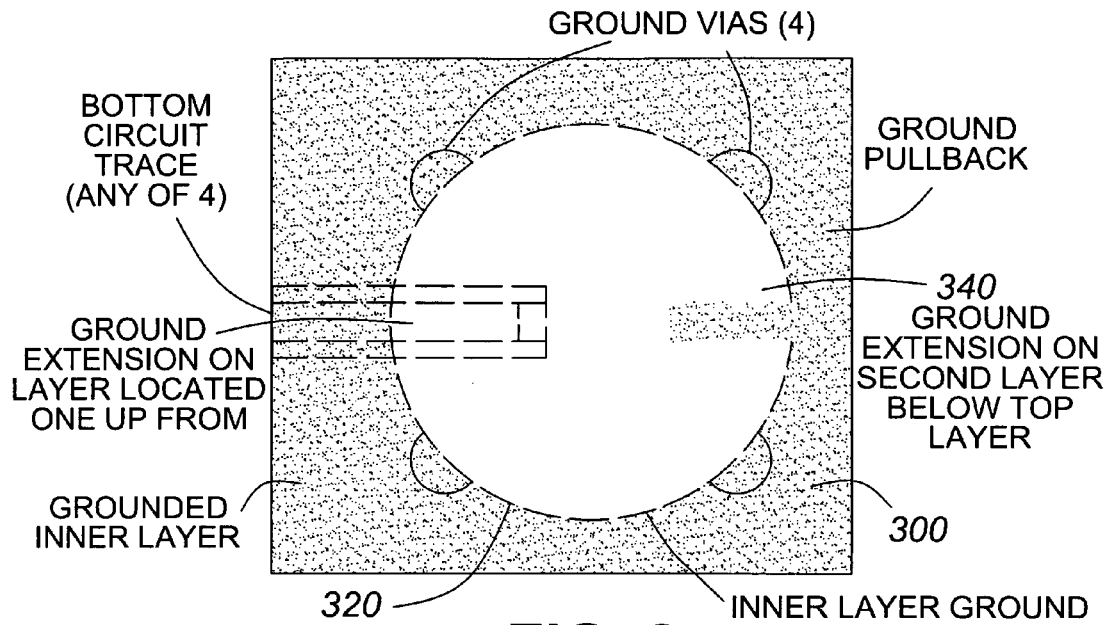
FIG. 3 shows a simplified top view of an inner ground layer below the top layer of the circuit board in FIG. 1 in accordance with a preferred embodiment of the present invention.

FIG. 3 depicts a simplified top view of an inner ground layer 300 below the top layer 175 of the printed circuit board 100 in FIG. 2 in accordance with a second aspect of the present invention. As seen, the inner ground layer 300 has the ground plane topology depicted by the dashed circle (inner layer ground pullback region) 160 in FIG. 1. Specifically, in FIG. 3, a corresponding inner layer ground pull back region is indicated by the dashed circle 320. However, in this case, a ground extension section 340 is further added to compensate for the inductance of the signal trace section 1 18 in FIG. 1 which would not ordinarily have its associate ground plane underneath it due to the standard size of inner layer ground pull back regions. It will be appreciated that, although the ground extension section 340 shown in FIG. 3 is rectangular in shape, the geometry of such ground extension section may vary for optimization of performance of the particular interconnection structure at hand. For example, a ground extension section which is triangular or half-circular in geometry may also be employed.

The discussion to this point has been for situations in which the signal conductor via extends from the top layer of a printed circuit board to the bottom layer i.e. all the way through the circuit board. It is possible, however, to apply the teachings of the present invention to intervening or inner layers with some modifications as will now be described.

When the signal conductor via is to be tapped off at an inner layer, for example, the bottom layer (or end) pad for the entire via will still reside on the bottom layer of the printed circuit board (for fabrication purposes as described earlier). An inner pad at the tap-off point is, in effect, connected to the uniform transmission line made up of the signal conductor via and the surrounding ground vias nearby. This combination transforms the end capacitance from the bottom layer pad to the inner tap-off point thereby presenting an impedance discontinuity at the tap-off point. Depending on the particular frequency of device operation, this impedance discontinuity may be inductive or capacitive in nature.

Specifically, the impedance, which incorporates the capacitance created by the pad at the bottom of the via (due to field lines coupling to nearby ground regions on the perimeter of the pad) is transformed over the length of the transmission line formed by the coaxial-like structure of the signal conductor via and surrounding ground vias. That is, when the capacitance of the bottom layer pad is viewed from the tap-off point, the impedance value is slightly different from that at the bottom layer pad due to a small difference in electrical path length. In other words, the impedance value changes as one travels along the transmission line from the bottom of the circuit board up towards the tap-off point. This distance is electrically small thereby still presenting a capacitive value at the tap-off point (but a slightly different value from that which is present at the bottom pad alone).

In cases where via holes go completely through the circuit board and where a certain signal conductor via is to be tapped off part way down the via structure, the rest of the via beyond the tap-off point (sometimes referred to in the art as a stub) creates another impedance discontinuity causing undesirable signal reflections at certain frequencies. One solution to this problem is to use blind vias for interconnecting signal traces from top surface layers to a prescribed inner layer. A blind via extends from a top surface through only a portion of the layers of a multi-layer printed circuit board. It is, however, undesirable from a manufacturing standpoint to drill blind vias of multiple depths. An alternative technique for eliminating stubs is to remove the stub portions of the via by drilling them out of the board. Unfortunately, this technique requires additional manufacturing steps and thereby increases the cost of the board. However, in accordance with a further aspect of the present invention, an impedance discontinuity presented by the unused stub portion of a signal conductor via may be compensated over a narrow frequency range as outlined below.

It should be clear, therefore, that at the inner layer tap-off point, two capacitances are actually present. One is the transformed end capacitance from the pad at the bottom of the signal conductor via and the other is the capacitance created by the pad at the tap-off point. Both capacitances are effectively in parallel (to ground) with the signal conductor via. Thus, the total admittance presented by these capacitances at the tap-off point comprises a summation of two imaginary terms, $jB_1$ and $jB_2$ where $B_1$ represents the susceptance of the transformed end capacitance and $B_2$ represents the susceptance from the pad capacitance at the tap-off point. To "resonate out" the undesired impedance resulting from these two capacitive effects, the total admittance at the tap-off point must be real which may be accomplished by adding a component $-jB_3$ where $-jB_3=jB_1+jB_2$. The value $-jB_3$ may be realized by introducing an inductive element in parallel with the tap-off point (i.e. one end of the inductive element must be grounded and the other end tied to the tap-off point).

The inductive element (and its associated reactive impedance) referred to above may be generated using a length of transmission line connected to the signal path. This technique is commonly referred to in the art as creating a "matching stub". Then, in the same way that the capacitance at the bottom of the circuit board is transformed to a new capacitance value at the tap-off point, the grounded inductance value is transformed through the length of the stub. By adjusting the length of the stub, the value of $-jB_3$ may be varied to negate the undesired impedance components $jB_1$ and $jB_2$. It should be noted that this "resonating out" procedure is valid only within a narrow frequency band of operation. Unfortunately, if the frequency changes by more than 10 per cent, complete cancellation does not occur as the $jB_1+jB_2$ values do not track oppositely with $-jB_3$ resulting in a decrease in resonance and causing a subsequent impedance discontinuity.

Figure 4:
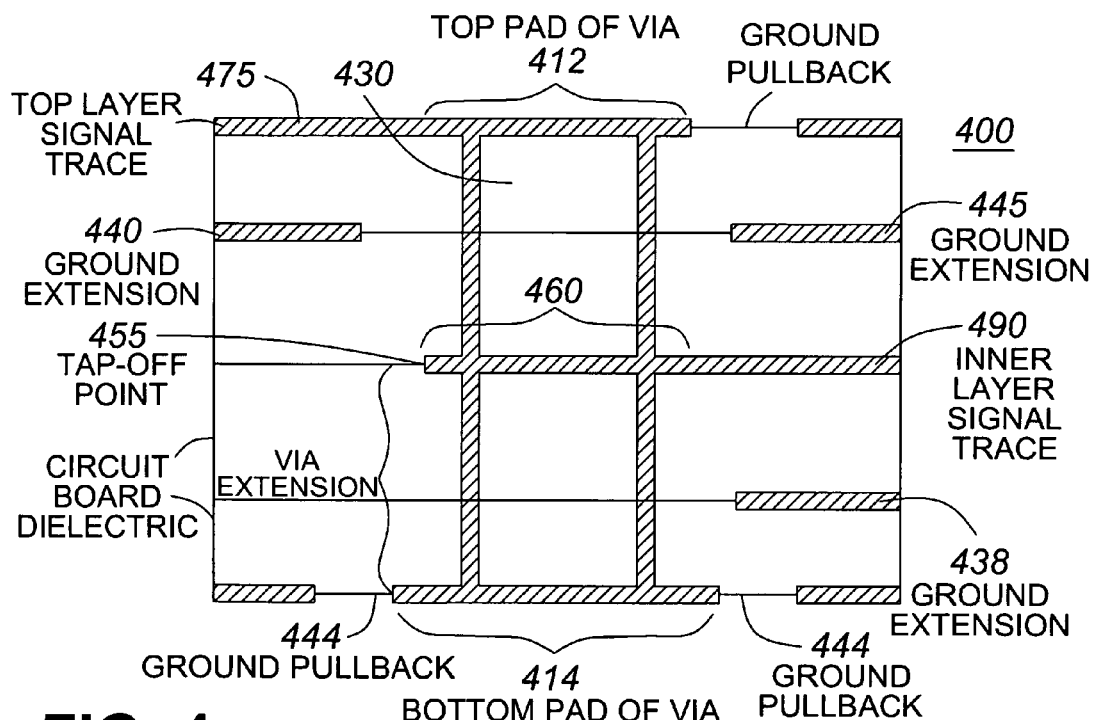
FIG. 4 depicts a cross-sectional view of a multilayer circuit board in the region of a signal trace-to-via transition constructed in accordance with the present invention.

FIG. 4 depicts a cross-sectional view of a multilayer printed circuit board constructed in accordance with a further aspect of the present invention 400 in the region of a signal trace-to-via transition. In this case, a top layer signal trace 475 runs up to a top via pad 412 of a signal conductor via 430. The signal conductor via 430 passes through the entire multilayer board 400 and terminates at a bottom via pad 414. A top layer ground pullback region 446 and a bottom layer ground pullback region 444 are indicated as shown. Furthermore, the embodiment in FIG. 4 includes a first ground extension 440 and second and third ground extensions 445 and 438. For this grounded metal layer, the first and second ground extension sections protrude into the cut away ground pullback section. The first ground extension section corresponds to a section of the conductive trace on the top layer that does not have the grounded metal layer underneath. The second ground extension section corresponds to the section of the inner conductive trace on the inner conductive layer that does not have a grounded metal layer above. The second grounded metal layer has the third around extension section also protruding into a corresponding cut away ground pullback section. The third ground extension section corresponds to a section of the inner conductive trace on the inner conductive layer and which does not have a grounded metal layer above. Both the grounded metal layers have a configuration similar to that illustrated in FIG. 3. An inner layer pad 460 at an inner layer tap-off point 455 is used to deliver the signal of concern to an inner layer signal trace 490.

The first ground extension 440 is used to compensate for the inductance of the section of the top layer signal trace 475 which does not have its associated ground plane underneath due to the standard size inner layer ground pull back regions. Similarly, ground extensions 438 and 445 are used to compensate for the inductance of the section of inner layer signal trace 490 which does not have its associated ground plane underneath or above. It should be noted here that a plurality of ground vias are assumed to be surrounding the signal conductor via 430 but have been removed in FIG. 4 for clarity.

For the case at hand and the geometry indicated, the inner layer tap-off point 455 where the signal is retrieved results in a transformed end pad capacitance which is increased due to the transmission line effect. This increased capacitance effect is in parallel with the signal path. However, by adding a matching stub with an inductive component as described above, the transformed end capacitive effect may be resonated away. Those skilled in the art will appreciate that the interconnection structures of the present invention are passive, bi-directional structures capable of carrying signals in either direction from an upper layer to a lower layer as well as from a lower layer to an upper layer.

Figure 5A:
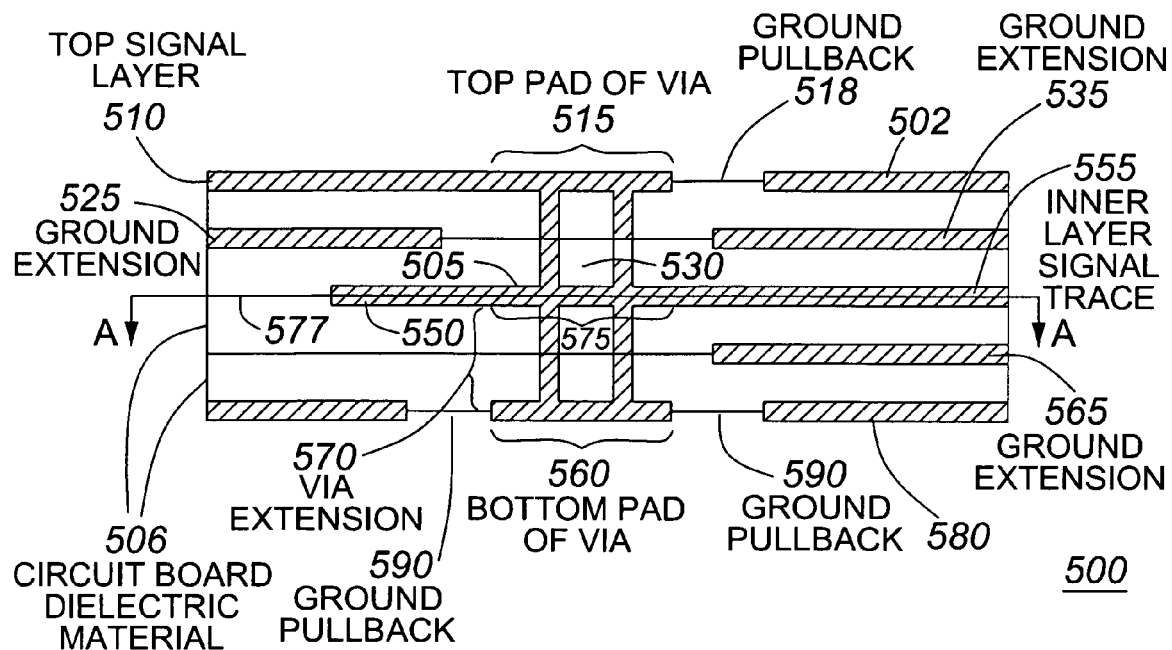
FIG. 5a illustrates a cross-sectional view of a multilayer circuit board in the region of a signal trace-to-via transition in accordance with a preferred embodiment of the present invention.

By incorporating all aspects of the present invention detailed above, a signal trace-to-via transition is formed that minimizes the impact of impedance discontinuities on signal integrity. In this regard, FIG. 5a depicts a cross-sectional view of a multilayer printed circuit board 500 constructed in accordance with a preferred embodiment of the present invention in the region of a signal trace-to-via transition. In this embodiment, a signal conductor via 530 extends through the entire printed circuit board 500 from a top conductive layer 502, through a plurality of dielectric layers 506 to a bottom conductive layer 580. A top layer signal trace 510 terminates at a top layer via pad 515 of the signal conductor via 530. The signal conductor via 530 terminates at a bottom layer via pad 560 on the bottom conductive layer 580 of the multilayer board 500. As indicated, a top layer ground pullback region 518 surrounds the top layer signal trace 510 and top layer via pad 515 to prevent the signal from shorting to ground. Similarly, the bottom conductive layer 580 has a corresponding bottom layer ground pullback region 590 surrounding the bottom layer via pad 560. The signal conductor via 530 is tapped off at an inner layer via pad 575 for delivery to an inner layer signal trace 555.

As in FIG. 4, a first ground extension 525 is used to compensate for the inductance of a section of signal trace 510 which does not have its associated ground plane underneath due to a standard size ground pullback region. Similarly, second and third ground extensions 535 and 565 are used to compensate for the inductance of a section of inner layer signal trace 555 which does not have its associated ground plane underneath or above due to standard size inner layer ground pullback regions. In FIG. 5a, the signal conductor via 530 extends beyond the tap-off point 505 and terminates at the bottom layer via pad 560. The signal conductor via extension beyond the inner layer tap-off point 505 and terminating at the bottom layer via pad 560 comprises a resonant stub 570 as described earlier which manifests itself as another impedance discontinuity.

However, in FIG. 5a, the inner layer tap-off point 505 of the circuit board 500 is modified to incorporate a matching stub portion 550 with an inductive component. The matching stub 550 is of a suitable length so that the undesired reactive impedance component (i.e. the increased end pad capacitive effect described earlier) may be resonated out. It should be noted that a plurality of ground vias surrounding the signal conductor via 530 (as in FIG. 1) are assumed to be present in this embodiment but have been omitted for the sake of clarity.

Figure 5B:
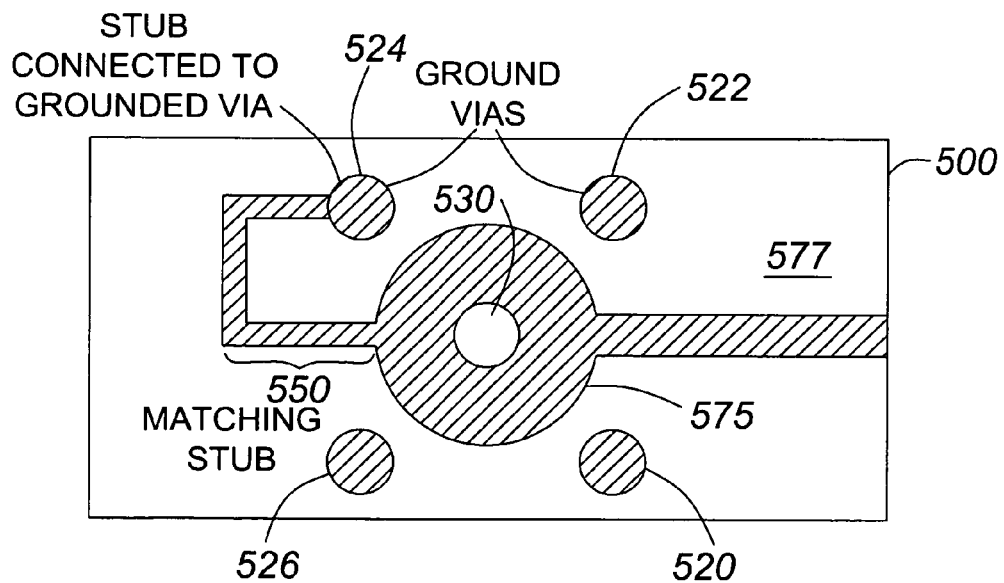
FIG. 5b depicts a top view of an inner layer of the circuit board in FIG. 5a taken along cut section line A—A.

FIG. 5b depicts a top view of an inner conductive layer 577 of the printed circuit board 500 in FIG. 5a taken along section line A-A. In this particular view, a plurality of ground vias 520, 522, 524 and 526 are shown to surround the signal conductor via 530. The signal conductor via 530 is tapped off at the inner layer via pad 575 which is connected to the inner layer signal trace 555. As described earlier, the matching stub 550 is attached to the inner layer via pad 575 and connected to ground via 524.

At this point, it should be noted that the diameters of the top, inner and bottom layer via pads of a signal conductor via constructed in accordance with the present invention may all be different or the same. Those skilled in the art will appreciate that signal traces on outer layers of the board are of the coplanar waveguide type but, alternatively, could be of a microstrip type. Furthermore, the inner layer signal trace as described above is of a type known in the art as stripline but could also be of a buried coplanar waveguide type.

In accordance with a preferred implementation of the present invention, the diameters of all the ground vias are preferably substantially the same while their respective spacing (i.e. distances) from the signal conductor via is also preferably uniform. However, it will be appreciated that the signal conductor via may have a diameter that is the same or different from that of the ground vias surrounding it. Similarly, for a given signal conductor via surrounded by a plurality of ground vias, the relative spacing of each of the plurality of ground vias from the given signal conductor via may vary. In addition, the ground vias may or may not have pads associated with them on each of the inner layers in order, for example, to connect to inner ground-return metal layers.

The radius of outer layer ground pullback regions is a variable quantity in that it may be equal to or less than the distance from the center of the ground vias to the center of the signal (middle) via but should be greater than the radius of the middle via pad. The radius of inner layer ground pullback regions may also vary and, specifically, is preferably equal to or less than the distance from the center of the ground vias to the center of the signal (middle) via but greater than the inner layer signal tap-off via pad radius. Finally, the signal conductor via pad radius is preferably less than the distance from the inner edge of the ground vias to the edge of the signal (middle) via.

It will also be appreciated that the number of ground vias used to surround the signal conductor via is not strictly fixed at four but may vary depending on the specific implementation and/or application. In this regard, suitable isolation and impedance matching may be achieved with the use of as little as two ground vias. Increasing the number of ground vias results in increased electrical isolation. Furthermore, the impedance of the quasi-coaxial-like structure of the signal conductor via and surrounding ground vias may be controlled by varying the diameter of the signal conductor vias and the diameter of the ground vias, as well as their relative position from one other. An important benefit of the teachings of the present invention is that propagation of signals in a package employing the proposed via configuration is enhanced while cross talk between signal conductors is minimized. Advantageously, the electrical isolation provided by the novel circuit board topology of the present invention may also permit the circuit board designer to tighten the space between two circuit regions.

Generally speaking, conductive signal traces are formed on printed circuit boards for carrying data and/or power signals between components attached to or mounted on the board. In this regard, space considerations often require the use of both sides of a single board (or multilayer boards) with conductive signal traces formed on each side of a suitable substrate. Specifically, to ease routing congestion of signal traces for a circuit while preserving board space, a signal trace on a first side of a board may be connected to a signal trace on a second side of the board using the via hole structure and topology described above.

More importantly, in view of the high frequencies used in today's wireless communication systems, it is desirable to be able to transmit such high frequency signals between the signal conductor traces on different layers of a circuit board (within an RF module for example) without degrading transmission characteristics. Specifically, compensation for the impedance discontinuities inherent at signal trace-to-via transitions is critical to the adequate performance of radio frequency (RF) circuits. The novel via hole interconnection structure and associated circuit topology of the present invention is advantageous to the practical implementation and performance of emerging RF technologies as will now be described.

For radios to communicate in a wireless communication system, the radios need antennas to radiate their respective signals so that free-space propagation of signals occurs between them. The techniques of the present invention described above may be applied specifically to implement an antenna selection module circuit (hereinafter referred to as an ASM). In general, an n-to-m ASM is an electronic switching circuit used to route radio frequency (RF) signals from several of n radios to several of m directional antennas within a radio transceiver module in a wireless systems application. As an example, ASMs may be used within individual radio modules in a wireless local areas network (WLAN) environment. Furthermore, an ASM implementation incorporating the teachings of the present invention will now be described. It will be appreciated that such an RF circuit is useful to the backhaul strategy for radio systems in wireless local area network (WLAN) environments.

As an example, consider a 3-to-8 'any radio port-to-any antenna port' ASM architecture where a first given radio may be connected to any one of eight possible antennas, a second radio may be connected to any one of a possible seven remaining antennas and, finally, a third radio may be connected to any one of a possible six remaining antennas. The 3-to-8 radio port-to-antenna port switching may be accomplished with the use of switches. Using this switching, the optimal antenna for transmission or reception of a radio signal from or to any of the three possible radios may be selected by the strength of the corresponding radio signal (or according to other criteria such as reduction of interference from a given direction etc.). This ensures that, in the cluster of 8 antennas, the optimal antenna is used for a given link direction. As an example, an antenna selection method as disclosed in U.S. application Ser. No. 10/340,148 filed Jan. 10, 2003 (the assignee of which is the same as the present application) may be used to perform antenna selection with an ASM architecture according to the present invention.

In addition to the above-mentioned RF routing function, an ASM embodiment according to the teachings of the present invention will typically mimic the "front-end" of WLAN radios by having copies of the power amplifiers and low noise amplifiers that are normally found in the first stages of standard communication radio designs. This is done to compensate for the added losses encountered in the routing function i.e. the switches used to route the RF signals are not lossless. Analog and digital signals used by these "front-ends" may also be routed from each of the radios connected to the ASM. These signals can be independent from radio to radio so that each radio can transmit or receive at times of its choosing, separate from the timing of the other radios involved. In other words, the individual radios do not need to be synchronized in any given way of operation to make use of the ASM. In addition to the above-mentioned functionality, the design of an ASM must also maintain a sufficiently high level of isolation between the paths used by each of the radios so that self-interference between any of the radios is kept to a minimum. Thus, the complexity of the switching track routing fundamental to the operation of an n radio port to m antenna port ASM requires that signals be moved between at least two circuit layers. In this manner, paths (i.e. signal traces) may be crossed over in light of space constraints, routing track congestion and electrical isolation requirements. The present invention discloses novel circuit board topologies and techniques which may be used to move signals between various layers of a printed circuit board at RF frequencies while still maintaining suitable electrical isolation as described below.

Figure 6:
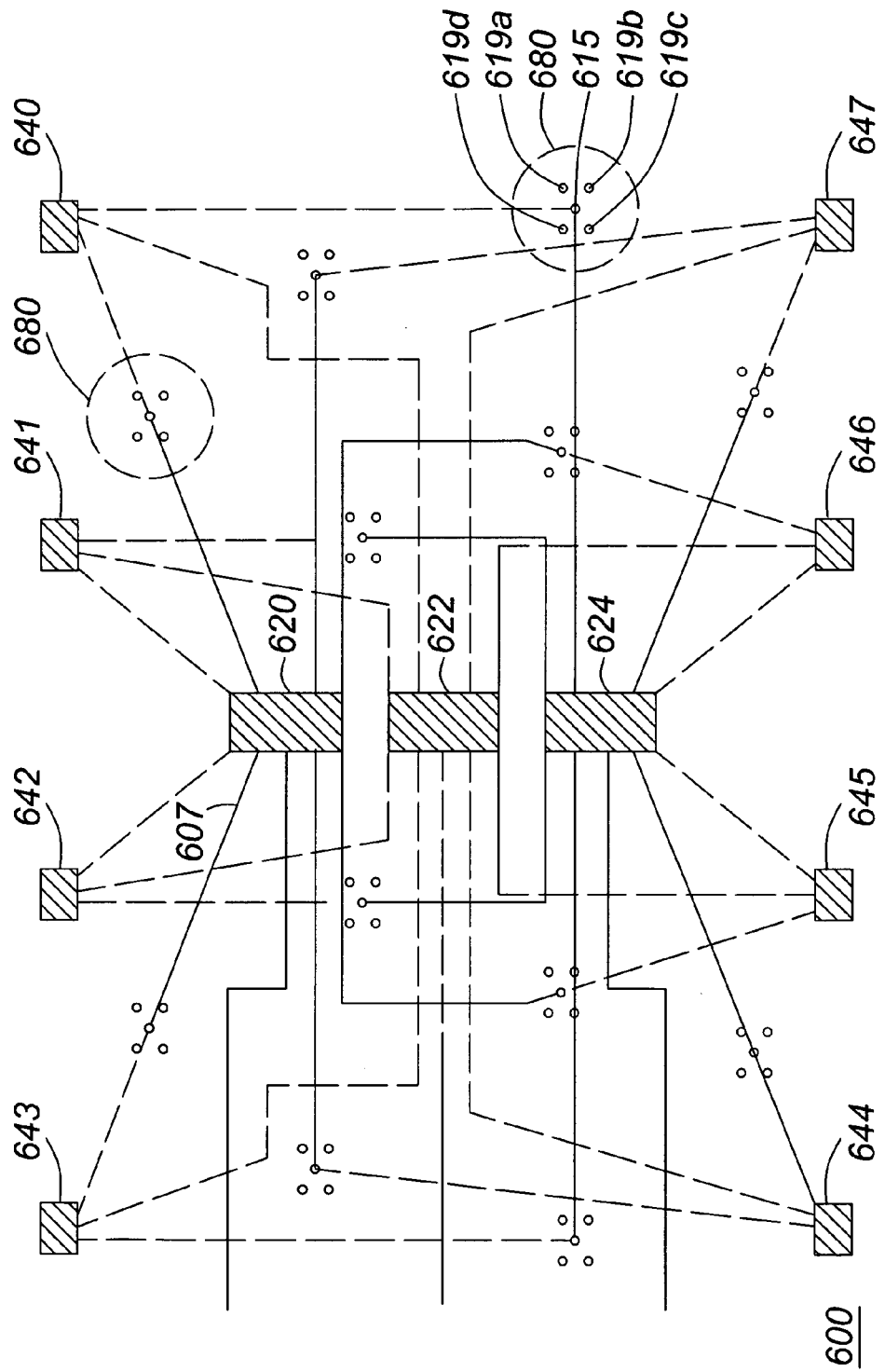
FIG. 6 depicts a 3-to-8 antenna switch matrix (ASM) architecture according to a preferred aspect of the present invention.

FIG. 6 depicts a 3-to-8 antenna selection module (ASM) architecture 600 according to a preferred aspect of the present invention. The ASM consists of a plurality of radio ports 620, 622 and 624 connected to a plurality of antenna ports 640, 641, . . . , 647. In particular, each radio port 620, 622 and 624 is connected to each of the eight antenna ports 640, . . . , 647. Or conversely, each antenna port 640, 641 . . . , 647 is connected to each of the three radio ports 620, 622 and 624. As mentioned above, space constraints, electrical isolation considerations as well as the complexity of the switching track routing requires signals to be moved between at least two circuit layers so that paths may be crossed over and to ensure that self-interference between radios is kept to a minimum. Accordingly, in FIG. 6, dashed lines 603 represent signal traces which are, for example, on a top conductive layer of a double-sided board while solid lines 607 indicate signal traces which are on a bottom conductive layer of the double-sided board.

To provide the electrical interconnection between the signal traces on the two conductive layers of the ASM, the circuit topology proposed in FIG. 1 (a signal conductor via surrounded by a plurality of ground vias) is used. Specifically, in FIG. 6, a plurality of interconnection structures 680 are indicated at each solid line to dashed line transition region. As shown, each interconnection structure 680 consists of a centre signal conductor 615 via surrounded by four ground vias 619a, 619b, 619c and 619d in accordance with the teachings of the present invention. In this way, suitable electrical interconnection and isolation is provided between signal traces on the top and bottom layers of the board. Furthermore, the plurality of ground vias surrounding each signal via aid in mitigating the parasitic effects introduced by the signal vias themselves. Advantageously, using the novel via interconnection structure of the present invention in this way allows for high frequency signals to be moved between the two circuit layers of the ASM architecture without a degradation in signal integrity which would otherwise arise from impedance discontinuities.

It will be appreciated that the antenna selection module (ASM) of FIG. 6 will preferably be located at a point in the transmit and receive chain where the difference in signal levels between the signal in the transmit chain and the signal in the receive chain is relatively small with respect to the difference in signal levels as seen at the antennas. Accordingly, gain blocks (not shown) consisting of radio frequency amplifiers, filters and transmit/receive switches, may be placed on the antenna end of the arrangement in the ASM architecture of FIG. 6. By virtue of this architectural decision, the isolation level required by the switching arrangement is reduced by the sum of the transmit and receive gains. Advantageously, this simplifies the switching arrangement to the extent that commercial grade switches may be used.

Therefore, with regard to FIG. 6, the 3-to-8 'radio port-to-antenna port' switching may be accomplished with an array of commercially available switches (not shown). For example, each of the three radios ports 620, 622 and 624 may be connected to a standard 1:8 switch. Each of the eight outputs from the 1:8 switch is routed to a corresponding 4:1 switch located at each antenna port 640, 641, . . . , 647. In this particular implementation, one port at each 4:1 switch should be connected to a matched load in order to provide a null state for the device since only three of the switch inputs are to be used. Beyond each 4:1 switch is the corresponding antenna port 640, 641, . . . , 647.

In terms of operation, the corresponding 1:8 switch at each radio port 620, 622 and 624 is instructed to configure itself so that an appropriate antenna port 640, 641, . . . , or 647 is selected. Specifically, instructions directing each 1:8 switch which way to configure itself may come from a microcontroller or other digital circuit which analyzes the quality of the radio signal processed by the backhaul radio selected to be connected to a given antenna. Here, quality can mean signal strength level or other criteria as appropriate. It will be appreciated that this operation may also be done manually by a microcontroller or digital circuit operated by an installer.

In a similar manner, the corresponding 4:1 switch at each antenna port 640, 641, . . . , 647 is configured to select the appropriate radio port 620, 622 or 624 that it should be connecting to. Since each switch provides isolation between its output ports on the order of 25 to 30 dB, the combination of the isolation from a particular 1:8 switch added to the isolation from a corresponding 4:1 switch results in a net isolation of approximately 50 to 60 dB. To ensure adequate performance of the ASM, it is important that the lowest (or weakest) point of isolation arise from the coupling between antennas as opposed to the switching arrangement itself so that optimal performance is achieved by the backhaul radios 620, 622 and 624. Since one or two of the radios can be transmitting while the third is receiving, this isolation criteria is important to minimize the level of self-interference between radios within the same module or box. Therefore, by providing more isolation in the ASM than what is achieved between the antennas, the overall self-interference performance can be conveniently predicted and deduced from antenna to antenna isolation alone.

Advantageously, in a radio system including 3-to-8 ASMs incorporating the novel circuit board topology and teachings of the present invention, the ASMs may be used for one, two or three radios operating simultaneously. The ASMs can accomplish this in a way that maintains high isolation between the individual antenna ports. The band of operation is typically 5 to 6 GHz but such ASMs may provide this function over a broad range of frequencies. Essentially, this allows an installer to mount a radio system transceiver module on a pole or other support structure and set which antenna, possibly in a circle of antennas or other related positions, is to be used to provide a radio link in a given direction.

The complexity of the 3-to-8 radio port to antenna port switching track routing is fundamental to the operation of the antenna selection module (ASM). For a 2-to-8 radio port to antenna port arrangement, all of the signal traces may be routed on a single circuit board layer. With the addition of a third radio port, however, those skilled in the art will appreciate that signals must be moved between at least two circuit layers so that paths (i.e. signal traces) may be crossed over in light of routing track congestion and space constraints while still maintaining suitable electrical isolation. Thus, the present invention discloses novel circuit board topologies and techniques which may be used to move signals between various layers of a printed circuit board at RF frequencies.

While preferred embodiments have been described and illustrated, it will be apparent to one skilled in the art that numerous modifications, variations and adaptations may be made without departing from the scope of the invention as defined in the claims appended hereto.

We claim:

1. A multilayer printed circuit board for use in a radio frequency communication system, said multilayer printed circuit board comprising:
    at least two conductive layers, each conductive layer having a conductive trace formed thereon which terminates at a via pad;
    an interconnection structure comprising:
        a center signal conductor via connected at each end to a via pad on one of said at least two conductive layers, wherein said signal conductor via is for propagating electrical signals between conductive traces on different conductive layers of said printed circuit board;
        a plurality of ground vias surrounding said signal conductor via, said plurality of ground vias having a position relative to said signal conductor via based upon-a desired overall impedance of said interconnection structure;
    at least one inner ground metal layer, each inner ground metal layer corresponding to one of said conducting layers, each inner ground metal layer having a ground pullback section cut away in a region surrounding said signal conductor via, each inner ground metal layer providing a ground return path for said corresponding conductive layer, each inner ground metal layer further comprising a ground extension section corresponding to a section of said conductive trace on said corresponding conductive layer, said ground extension section protruding into said ground pullback section and being unconnected to said signal conductor via, each inner ground metal layer being immediately adjacent said corresponding conductive layer, said section of said conductive trace being isolated from a ground plane of said conductive layer.

2. A multilayer primed circuit board according to claim 1 wherein said cut away ground pullback section of said at least one inner ground metal layer has a radius greater than the radius of said via pad.

3. A multilayer printed circuit board according to claim 1 wherein said plurality of ground vias have a diameter based upon the desired overall impedance of the interconnection structure.

4. A multilayer printed circuit board according to claim 1 wherein said cut away ground pullback section is concentric with said center signal conductor via and has a radius greater than the radius of said via pad.

5. A multilayer printed circuit board according to claim 1 wherein said board is used in an antenna selection module for connecting at least one of a plurality of radio pans to at least one of a plurality of antenna ports.

6. A multilayer printed circuit board according to claim 1 wherein each of said plurality of ground vias are substantially the same distance from said centre signal conductor via.

7. A multilayered printed circuit board according to claim 1 wherein said ground extension section extends said ground metal layer into said ground pullback region adjacent said section of said conductive trace on said corresponding conductive layer.

8. A multilayer printed circuit board according to claim 1 wherein each conductive layer has at least one Corresponding inner ground metal layer.

9. A multilayer printed circuit board according to claim 8 wherein an inner conductive layer has two corresponding inner ground metal layers, said inner conductive layer being between said corresponding inner ground metal layers.

* * * * *

UNITED STATES PATENT AND TRADEMARK OFFICE
CERTIFICATE OF CORRECTION

PATENT NO. : 7,154,356 B2  
APPLICATION NO. : 11/351041  
DATED : December 26, 2006  
INVENTOR(S) : Brunette et al.

Page 1 of 1

It is certified that error appears in the above-identified patent and that said Letters Patent is hereby corrected as shown below:

In Column 5, Line 65, delete "1 18" and insert -- 118 --, therefor.

In Column 7, Line 37, delete "43O." and insert -- 430. --, therefor.

In Column 13, Line 29, in Claim 1, delete "upon-a" and insert -- upon a --, therefor.

In Column 14, Line 7, in Claim 2, delete "primed" and insert -- printed --, therefor.

In Column 14, Line 21, in Claim 5, delete "pans" and insert -- ports --, therefor.

In Column 14, Line 27, in Claim 7, delete "multilayered" and insert -- multilayer --, therefor.

In Column 14, Lines 34-35, in Claim 8, delete "Corresponding" and insert -- corresponding --, therefor.

Signed and Sealed this  
Twelfth Day of February, 2013

Teresa Stanek Rea  
*Acting Director of the United States Patent and Trademark Office*